(12) United States Patent
Zhou et al.

(10) Patent No.: US 12,513,917 B2
(45) Date of Patent: Dec. 30, 2025

(54) METHOD FOR MANUFACTURING CAPACITOR ARRAY, CAPACITOR ARRAY, AND SEMICONDUCTOR DEVICE

(71) Applicant: CHANGXIN MEMORY TECHNOLOGIES, INC., Hefei (CN)

(72) Inventors: Liutao Zhou, Hefei (CN); Shuo Pan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 402 days.

(21) Appl. No.: 18/170,514

(22) Filed: Feb. 16, 2023

(65) Prior Publication Data

US 2023/0231007 A1    Jul. 20, 2023

Related U.S. Application Data

(63) Continuation of application No. PCT/CN2021/135728, filed on Dec. 6, 2021.

(30) Foreign Application Priority Data

Oct. 13, 2021   (CN) ............................ 202111191283.9

(51) Int. Cl.
*H10D 1/00*   (2025.01)
*H01L 23/522*   (2006.01)
(Continued)

(52) U.S. Cl.
CPC ......... *H10D 1/043* (2025.01); *H01L 23/5226* (2013.01); *H01L 23/5283* (2013.01); *H10B 12/03* (2023.02); *H10B 12/30* (2023.02); *H10D 1/714* (2025.01); *H10D 1/716* (2025.01); *H10N 97/00* (2023.02)

(58) Field of Classification Search
CPC ...... H10B 12/01; H10B 12/03; H10B 12/033; H10D 1/043; H10D 1/714; H10D 1/716
See application file for complete search history.

(56) References Cited

U.S. PATENT DOCUMENTS 8,415,225 B2   4/2013   Kwon
2009/0146254 A1*   6/2009   Hirota ................... H10D 1/692
257/532

(Continued)

FOREIGN PATENT DOCUMENTS

CN   107895721 A   4/2018
CN   108110025 A   6/2018
(Continued)

OTHER PUBLICATIONS

CN 108110025 A—English Machine Translation (Year: 2025).*
CN first office action in application No. 202111191283.9, mailed on Sep. 27, 2025.

*Primary Examiner* — Jose R Diaz
(74) *Attorney, Agent, or Firm* — Syncoda LLC; Feng Ma (57) ABSTRACT

A method for manufacturing a capacitor array includes: providing a substrate provided with a device area configured for forming a capacitor and a peripheral area located at a periphery of the device area; forming successively a first support layer and a first sacrificial layer on the substrate; etching the first sacrificial layer of the peripheral area to expose the first support layer, so as to form a first via; and filling the first via to form a support pillar.

12 Claims, 9 Drawing Sheets

(51) Int. Cl.
*H01L 23/528* (2006.01)
*H10B 12/00* (2023.01)
*H10D 1/68* (2025.01)
*H10N 97/00* (2023.01)

(56) References Cited

U.S. PATENT DOCUMENTS

| | | | |
|---|---|---|---|
| 2011/0092044 A1* | 4/2011 | Huang | H10D 1/716 |
| | | | 438/387 |
| 2012/0052648 A1 | 3/2012 | Kwon | |
| 2013/0175667 A1 | 7/2013 | Kwon | |
| 2022/0059540 A1* | 2/2022 | Zhao | H10D 1/042 |

FOREIGN PATENT DOCUMENTS

| | | |
|---|---|---|
| CN | 110970403 A | 4/2020 |
| CN | 112786537 A | 5/2021 |
| CN | 113161356 A | 7/2021 |
| CN | 113394162 A | 9/2021 |
| CN | 113410179 A | 9/2021 |

* cited by examiner

METHOD FOR MANUFACTURING CAPACITOR ARRAY, CAPACITOR ARRAY, AND SEMICONDUCTOR DEVICE

CROSS-REFERENCE TO RELATED APPLICATIONS

This is a continuation of International Patent Application No. PCT/CN2021/135728 filed on Dec. 6, 2021, which claims priority to Chinese Patent Application No. 202111191283.9 filed on Oct. 13, 2021. The disclosures of the above-referenced applications are hereby incorporated by reference in their entirety.

BACKGROUND

With the continuous development of a semiconductor technology, Dynamic Random Access Memory (DRAM), as a novel semiconductor memory device, is increasingly used in the manufacture and usage of device such as computers. The DRAM is composed of a plurality of repeated storage units, and each storage unit generally includes a capacitor and a transistor.

However, as the device size of the DRAM decreases, in order to cause the capacitor to store more charges, the aspect ratio of the capacitor becomes larger and larger, resulting in easy collapse or peeling of the capacitor.

SUMMARY

The disclosure relates to the field of semiconductor devices, and in particular, to a method for manufacturing a capacitor array, a capacitor array, and a semiconductor device.

A first aspect of an embodiment of the disclosure provides a method for manufacturing a capacitor array. The method includes the following operations.

A substrate provided with a device area configured for forming a capacitor and a peripheral area located at a periphery of the device area is provided.

A first support layer and a first sacrificial layer are successively formed on the substrate.

The first sacrificial layer in the peripheral area is etched to expose the first support layer, so as to form a first via.

The first via is filled to form a support pillar.

A second aspect of an embodiment of the disclosure provides a capacitor array. The capacitor array includes a substrate, a first support layer, a second support layer, and a support pillar.

The substrate is provided with a device area configured for forming a capacitor and a peripheral area located at a periphery of the device area.

The first support layer is located on the substrate, and the second support layer is located on the first support layer.

The support pillar is located in the peripheral area, and is connected to the first support layer and the second support layer.

A third aspect of an embodiment of the disclosure provides a semiconductor device, including the capacitor array described in any one of the above embodiments.

The reference numerals are listed as follows:
10—Substrate; 11—Capacitor contact;
21—First support layer; 22—Second support layer; 23—Third support layer;
31—First sacrificial layer; 32—Second sacrificial layer;
401—First via; 40—Support pillar;
501—Second via; 50—Electrode layer;
60—Mask layer;
71—Mask opening; 72—First opening; 73—Second opening.

DETAILED DESCRIPTION

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, not all the features of the actual embodiments are described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, when the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. When the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for convenient description so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned upside down, then the elements or the features described as "below" or "underneath" or "under" other elements may be oriented "on" the other elements or features. Therefore, the exemplary terms "below" and "under" may include two upper and lower orientations. The device may be otherwise oriented (rotated by 90 degrees or other orientations) and the spatial descriptions used here are interpreted accordingly.

A purpose of the terms used here is only to describe the specific embodiments and not as limitation to the disclosure. In usage here, singular forms of "a", "an" and "said/the" are also intended to include plural forms, unless the context clearly indicates another mode. It should also be understood that terms "constitute" and/or "include", when used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below. However, the disclosure may also have other implementations in addition to these detailed descriptions.

Figure 1:
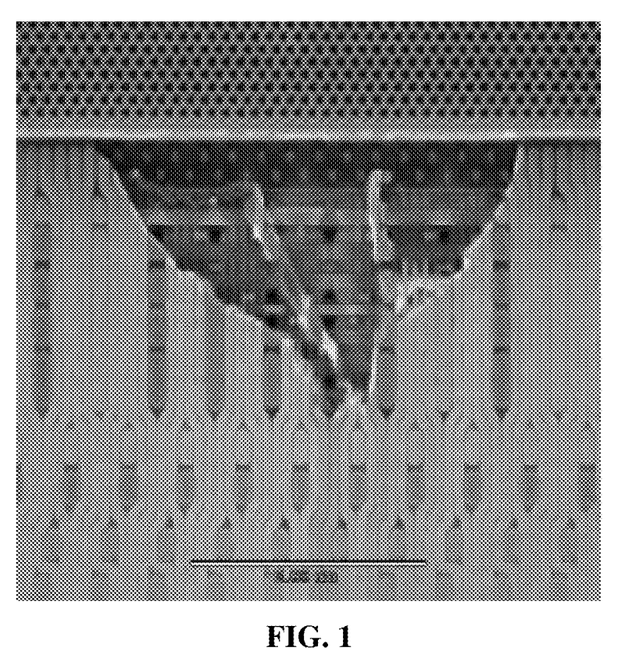
FIG. 1 is a scanning electron microscope diagram of a capacitor array in some implementations.

FIG. 1 is a scanning electron microscope diagram of a capacitor array in some implementations. As shown in the figure, a DRAM capacitor needs to be subjected to dry etching twice and acid etching (acid strip) twice during manufacturing to empty the capacitor so as to form a cell container. In this way, there is a certain risk of leakage of the acid solution from a storage area to the peripheral area. Since an area such as an array edge is a high risk area, the array edge area is easily damaged by acid leakage. In addition, the damaged capacitor is very unstable, peeling is easily formed in the follow-up stage, thereby affecting the performance of the capacitor.

Figure 2:
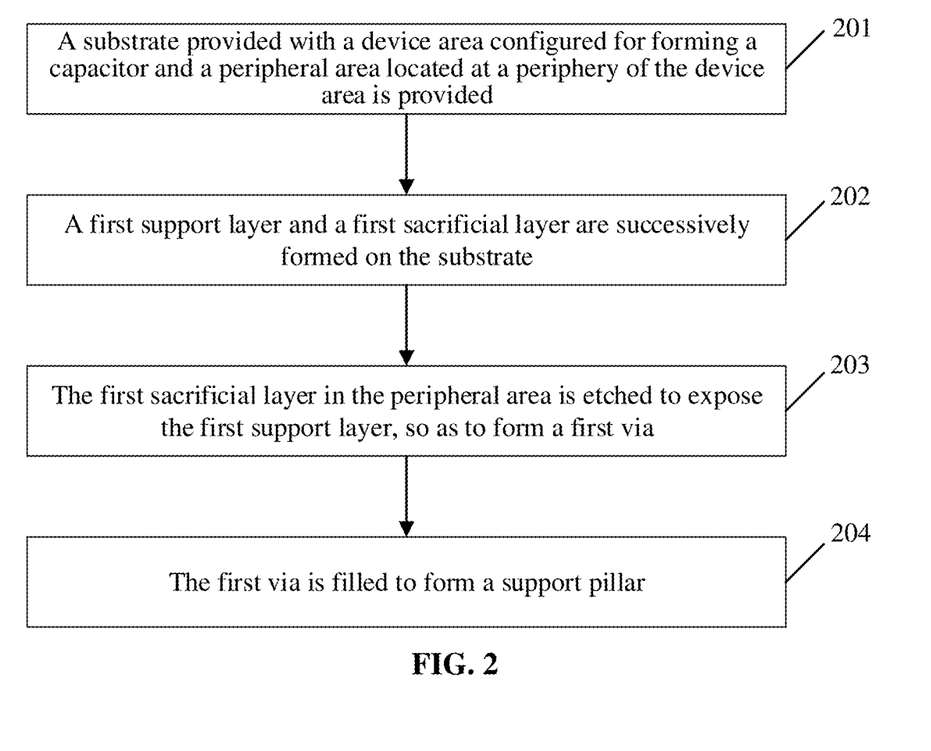
FIG. 2 is a schematic flowchart of a method for manufacturing a capacitor array according to an embodiment of the disclosure.

Based on this, an embodiment of the disclosure provides a method for manufacturing a capacitor array. Referring to FIG. 2 for details, as shown in the figure, the method includes the following steps.

At S201, a substrate provided with a device area configured for forming a capacitor and a peripheral area located at a periphery of the device area is provided.

At S202, a first support layer and a first sacrificial layer are successively formed on the substrate.

At S203, the first sacrificial layer of the peripheral area is etched to expose the first support layer, so as to form a first via.

At S204, the first via is filled to form a support pillar.

The method for manufacturing a capacitor array provided in the embodiments of the disclosure is further described in detail below with reference to specific embodiments.

FIG. 3A to FIG. 3L are schematic structural diagrams of a capacitor array during manufacturing according to an embodiment of the disclosure.

Figure 3A:
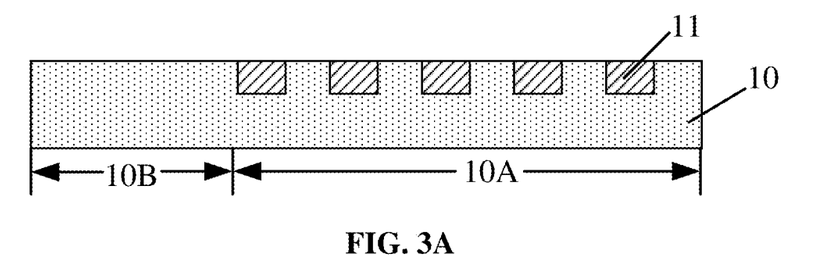
FIG. 3A is a first schematic structural diagram of a capacitor array during manufacturing according to an embodiment of the disclosure.

Firstly, referring to FIG. 3A, S201 is performed. A substrate 10 provided with a device area 10A configured for forming a capacitor and a peripheral area 10B located at a periphery of the device area 10A is provided.

The substrate 10 may be a monoatomic semiconductor material substrate (for example, a Silicon (Si) substrate, a germanium (Ge) substrate, and the like), a compound semiconductor material substrate (for example, a silicon germanium (SiGe) substrate), a Silicon-On-Insulator (SOI) substrate, Germanium-On-Insulator (GeOI) substrate, and the like.

The device area 10A and the peripheral area 10B may be isolated by means of a trench isolation structure (not shown in the figure).

By using the shallow trench isolation structure to insulate and isolate the device area 10A from the peripheral area 10B, short circuit between the device area 10A and the peripheral area 10B can be prevented, so that the operation performance of the device can be improved.

A capacitive contact 11 is formed in the substrate 10 and is electrically connected to the electrode layer of a capacitor formed subsequently.

Figure 3B:
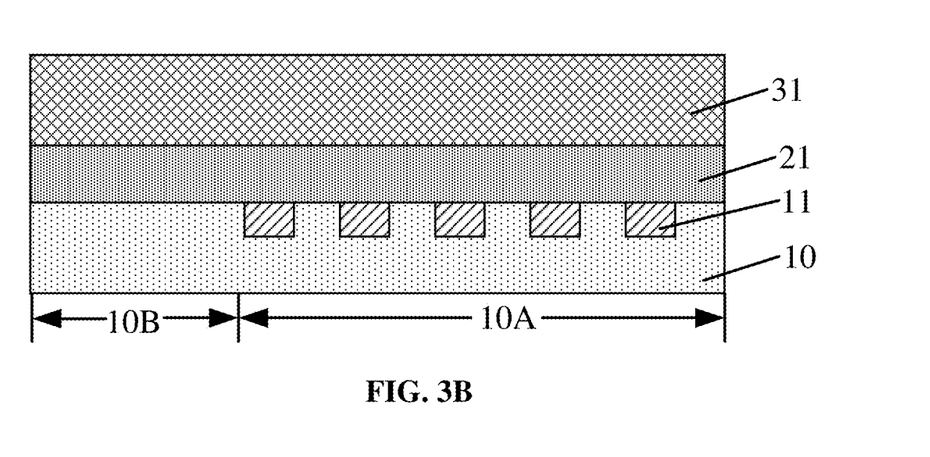
FIG. 3B is a second schematic structural diagram of a capacitor array during manufacturing according to an embodiment of the disclosure.

Next, referring to FIG. 3B, S202 is performed. A first support layer 21 and a first sacrificial layer 31 are successively formed on the substrate 10.

A material of the first support layer 21 includes, but is not limited to, silicon nitride. A material of the first sacrificial layer 31 includes, but is not limited to, silicon oxide.

The first support layer 21 and the first sacrificial layer 31 may both be formed by means of a deposition process, for example, may be formed by means of chemical vapor deposition.

Figure 3C:
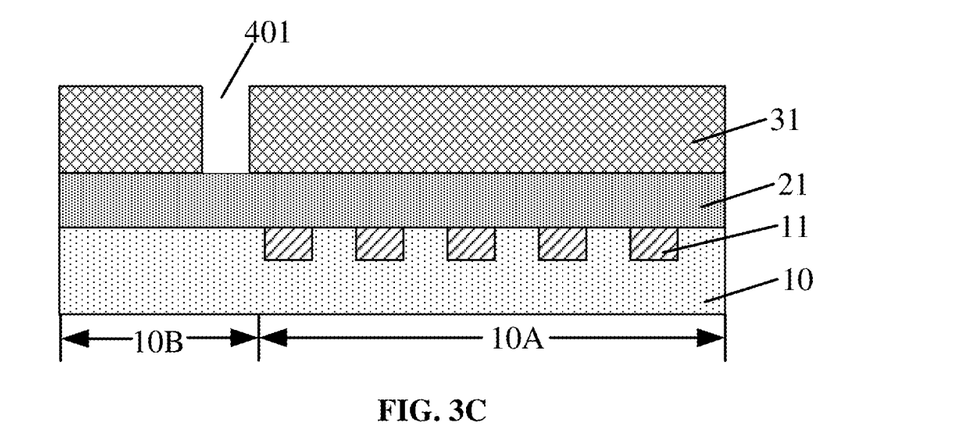
FIG. 3C is a third schematic structural diagram of a capacitor array during manufacturing according to an embodiment of the disclosure.

Next, referring to FIG. 3C, S203 is performed. The first sacrificial layer 31 in the peripheral area 10B is etched to expose the first support layer 21, so as to form a first via 401.

Specifically, a mask layer (not shown in the figure) may be first grown on an upper surface of the first sacrificial layer 31. Next, the mask layer is patterned to display a first via pattern to be etched on the mask layer. The mask layer may be patterned by means of photolithography. The mask layer may be a photoresist mask or a hard mask that is patterned based on a photolithographic mask. When the mask layer is the photoresist mask, the mask layer is specifically patterned by means of steps of exposure, development and removing of photoresist. Next, the first sacrificial layer 31 is etched according to the first via pattern to be etched, to expose the first support layer 21, so as to form the first via 401, and then the mask layer is removed.

Figure 3D:
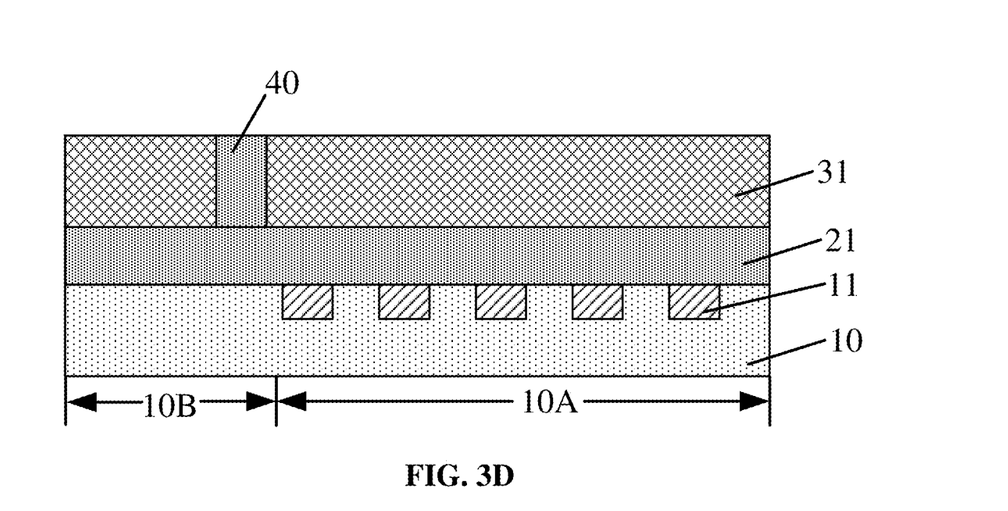
FIG. 3D is a fourth schematic structural diagram of a capacitor array during manufacturing according to an embodiment of the disclosure.

Next, referring to FIG. 3D, S204 is performed. The first via 401 is filled to form a support pillar 40.

A material of the support pillar 40 includes an acid-resisting material. Specifically, the material of the support pillar 40 includes, but is not limited to, silicon nitride. It is understandable that, by selecting the material of the support pillar to be the acid-resisting material, when wet etching is performed subsequently, penetration of the acid solution cannot occur, so that the stability of the capacitor can be improved.

It is understandable that, a thickness of the first sacrificial layer 31 defines a height of the formed support pillar 40. Therefore, the thickness of the first sacrificial layer 31 may be adjusted according to a height position of the support pillar 40 required to be formed.

Figure 3E:
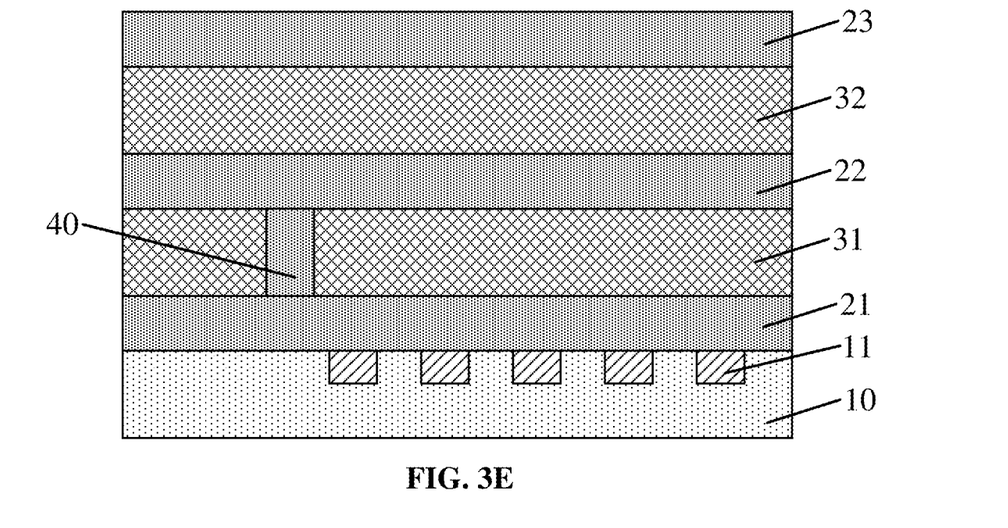
FIG. 3E is a fifth schematic structural diagram of a capacitor array during manufacturing according to an embodiment of the disclosure.
Figure 3F:
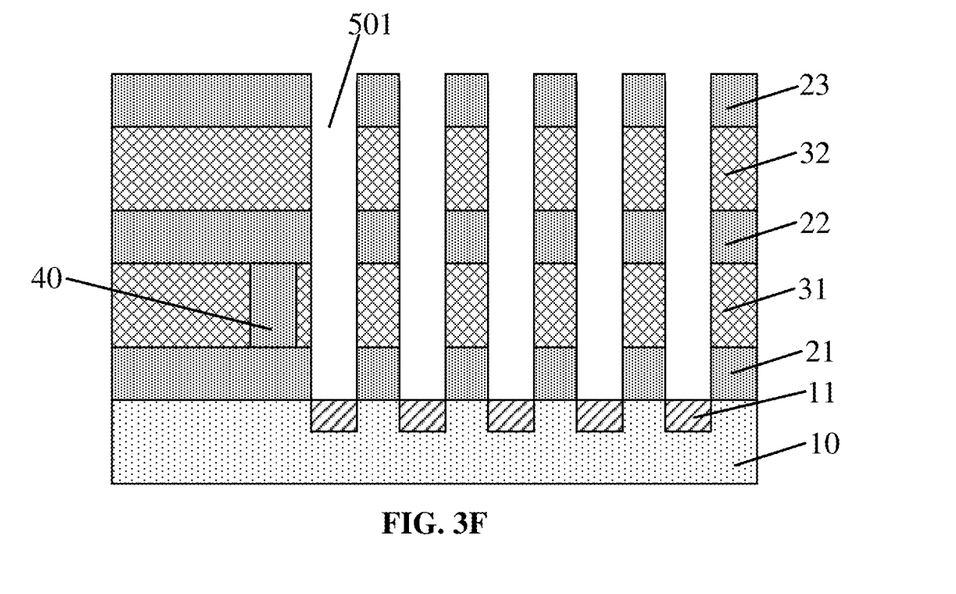
FIG. 3F is a sixth schematic structural diagram of a capacitor array during manufacturing according to an embodiment of the disclosure.

Next, referring to FIG. 3E and FIG. 3F, after the support pillar 40 is formed, a second support layer 22, a second sacrificial layer 32 and a third support layer 23 are successively formed on the first sacrificial layer 31. The second support layer 22, the second sacrificial layer 32, and the third support layer 23 form a laminated structure together with the first support layer 21 and the first sacrificial layer 31. The laminated structure in the device area 10A is etched to expose the substrate 10, so as to form second vias 501.

Specifically, a mask layer (not shown in the figure) may be first grown on an upper surface of the third support layer 23. Next, the mask layer is patterned to display a second via pattern to be etched on the mask layer. The mask layer may be patterned by means of photolithography. The mask layer may be a photoresist mask or a hard mask that is patterned based on a photolithographic mask. When the mask layer is the photoresist mask, the mask layer is specifically patterned by means of steps of exposure, development and degumming. Next, the laminated structure is etched according to the second via pattern to be etched, to expose the first support layer 21, so as to form the second vias 501, and then the mask layer is removed.

The capacitor contacts 11 in the substrate 10 are exposed from the second vias 501.

Materials of the second support layer 22 and the third support layer 23 include, but are not limited to, silicon nitride. A material of the second sacrificial layer 32 includes, but is not limited to, silicon oxide.

The second support layer 22, the second sacrificial layer 32 and the third support layer 23 may be formed by means of the deposition process, for example, may be formed by means of chemical vapor deposition.

In this embodiment of the disclosure, a plurality of support layers are arranged in stack manner, so that the stability of the device can be improved, and the risk of the breakage of the support layers can be reduced.

Figure 3G:
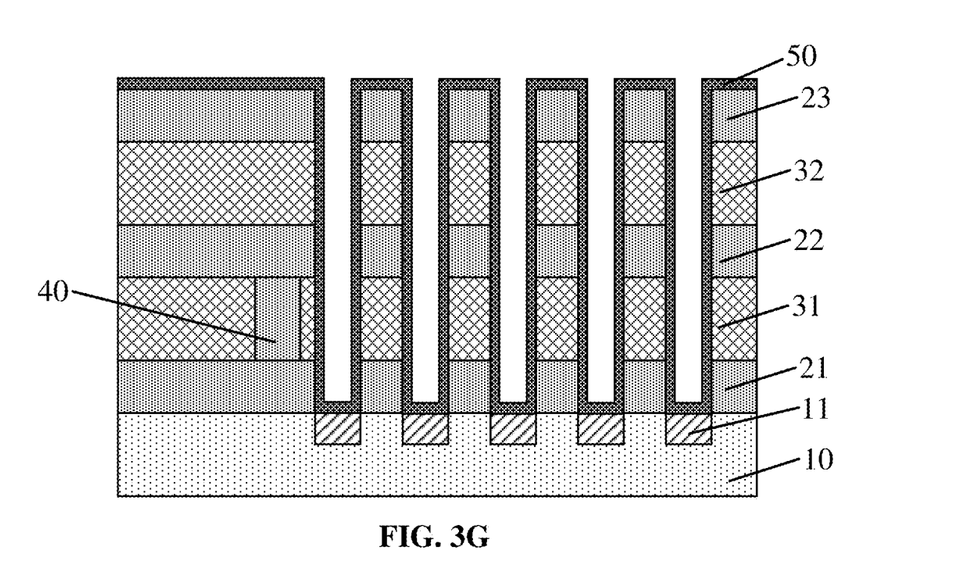
FIG. 3G is a seventh schematic structural diagram of a capacitor array during manufacturing according to an embodiment of the disclosure.

Next, referring to FIG. 3G, after the second vias 501 are formed, an electrode layer 50 is formed. The electrode layer 50 covers a sidewall and bottom surface of each of the second vias 501, so as to form cylindrical structures.

In some embodiments, as shown in FIG. 3G, the electrode layer 50 further covers the surface of the third support layer 23.

In some other embodiments, the electrode layer 50 does not cover the surface of the third support layer 23. Specifically, the electrode layer 50 may be formed by the deposition process, in combination with a planarization process. For example, firstly, an electrode material layer is formed on the substrate 10. The electrode material layer covers the bottom and sidewall of the second via 501, and covers the third support layer 23. Next, the planarization process (for example, a chemical mechanical polishing process) is performed, to remove a portion of the electrode material layer above the third support layer 23, so that the remaining electrode material layer only is formed in the second via 501, so as to form the electrode layer 50.

In addition, the capacitor contact 11 is exposed from the second via 501, so that the formed electrode layer 50 can be electrically connected to the capacitor contact 11 at the bottom of the second via 501.

The electrode layer 50 may be a polysilicon electrode, or may be a metal electrode. When the electrode layer 50 is the metal electrode, for example, may be formed by using titanium nitride (TiN).

Next, referring to FIG. 3H to FIG. 3L, after the electrode layer 50 is formed, a mask layer 60 is formed on the laminated structure. Based on the mask layer 60, mask openings 71 are formed. Based on the mask openings 71, the first sacrificial layer 31 and the second sacrificial layer 32 in the device area 10A, and the second support layer 22 and the third support layer 23 under the mask opening 71 in the device area 10A are removed. The reserved second support layer 22, the reserved third support layer 23 and the first support layer 21 are connected to an outer wall of a cylindrical structure formed by the electrode layer 50.

Specifically, the operation of removing the first sacrificial layer 31, the second sacrificial layer 32, and the second support layer 22 and the third support layer 23 under the mask openings 71 based on the mask openings 71 includes: forming first openings 72 in the third support layer 23 to expose the second sacrificial layer 32, based on the mask openings 71; removing the second sacrificial layer 32 based on the first openings 72; forming second openings 73 in the second support layer 22 to expose the first sacrificial layer 31; and removing the first sacrificial layer 31 based on the second openings 73.

It is to be noted that, the first opening 72 and the second opening 73 formed subsequently are formed based on the mask opening 71, and thus when the mask opening 71 is formed, on the basis of guaranteeing that the subsequent steps may completely remove the first sacrificial layer 31 and the second sacrificial layer 32, the mask opening 71 with a proper size is designed to decrease an etching area of the electrode layer 50, so that a superficial area of the second via 501 can be maximized, thereby increasing the charge storage capacity of the capacitor. Optionally, a shape of the mask opening 71 is one of a circle, an oval or a long-strip shape. An operator may select the shape of the corresponding mask opening 71 according to the number of the second vias 501 that are required to be opened, so that the highest acid pickling quality and efficiency can be achieved in the follow-up steps. Specifically, as shown in FIG. 4, any second via 501 used for forming the electrode layer 50 partially intersects with the mask opening 71, and any mask opening 71 partially intersects with at least one second via 501. For example, the second vias 501 are arranged in a matrix. Each 2×2 second vias 501 are used as an opening unit. Each opening unit may be correspondingly provided with one mask opening 71. The mask opening 71 partially intersects with each of four second vias 501 of the opening unit. It is to be noted that, FIG. 3A to FIG. 3L are top views of a capacitor array during manufacturing in a direction of a dotted line A-A' in FIG. 4.

Figure 3H:
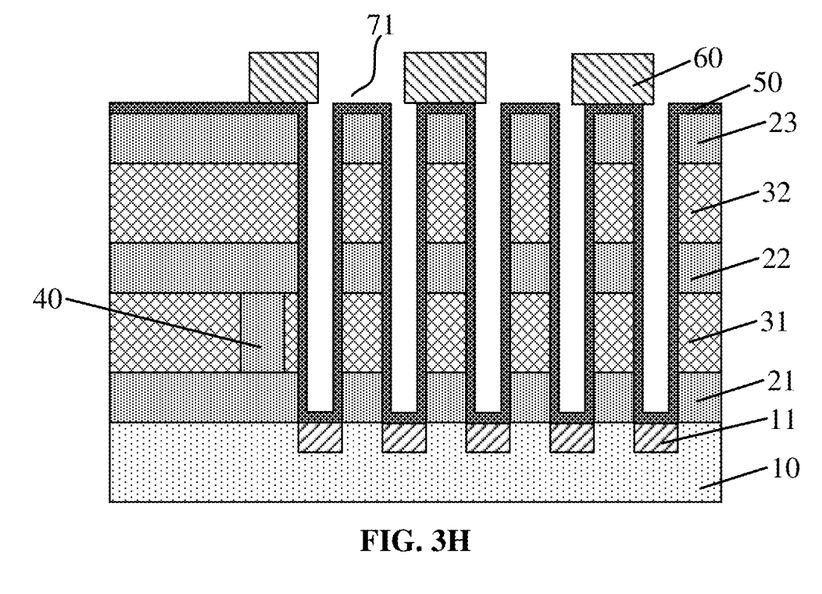
FIG. 3H is an eighth schematic structural diagram of a capacitor array during manufacturing according to an embodiment of the disclosure.
Figure 3I:
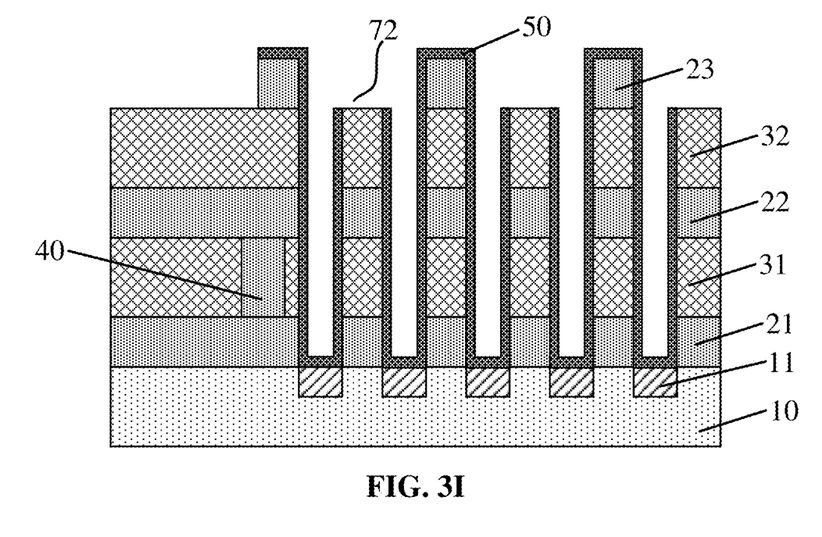
FIG. 3I is a ninth schematic structural diagram of a capacitor array during manufacturing according to an embodiment of the disclosure.

More specifically, firstly, as shown in FIG. 3H to FIG. 3I, the mask layer 60 may be first grown on the upper surface of the third support layer 23. Then the mask layer 60 is patterned, to display the mask openings 71 on the mask layer 60, so that the mask layer 60 may be patterned by means of photolithography. The mask layer 60 may be a photoresist mask or a hard mask that is patterned based on a photolithographic mask. When the mask layer 60 is the photoresist mask, the mask layer 60 is specifically patterned by means of steps of exposure, development and removing of photoresist. Next, based on the mask openings 71, the third support layer 23 under the mask openings 71 is removed by means of dry etching, to form a plurality of first openings 72 exposing the second sacrificial layer 32. The remaining third support layer is formed as the third support layer of the capacitor array. Before the third support layer 23 under the mask openings 71 is removed, the electrode layer 50 under the mask openings 71 that is located on the upper surface and side surface of the third support layer 23 is also removed. After the third support layer 23 under the mask openings 71 is removed, the mask layer 60 is removed.

Figure 3J:
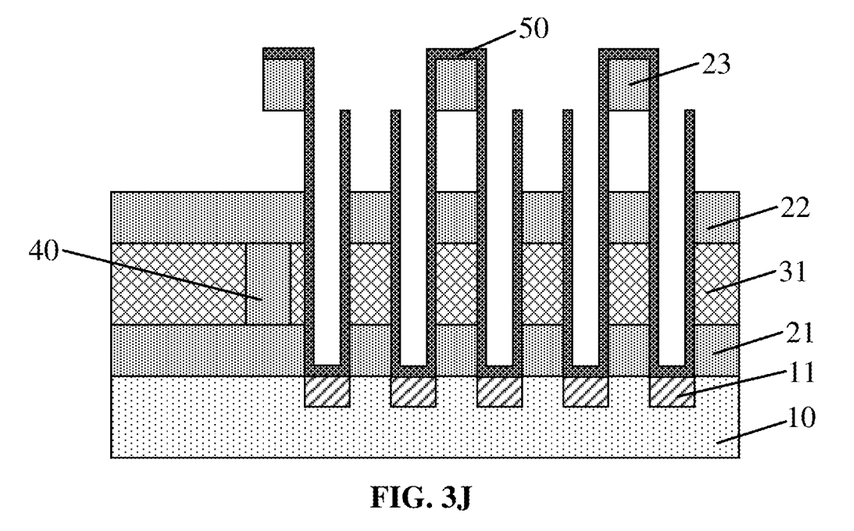
FIG. 3J is a tenth schematic structural diagram of a capacitor array during manufacturing according to an embodiment of the disclosure.

Next, as shown in FIG. 3J, the second sacrificial layer 32 is removed through the first openings 72 by means of wet etching, to expose the second support layer 22.

Specifically, based on the first openings 72, an acid solution may be injected, so as to remove the second sacrificial layer 32. It is to be noted that, according to a material of the second sacrificial layer 32, the corresponding acid solution may be selected, so that acid pickling efficiency can be enhanced, and the second sacrificial layer 32 may be guaranteed to be completely cleaned.

Figure 3K:
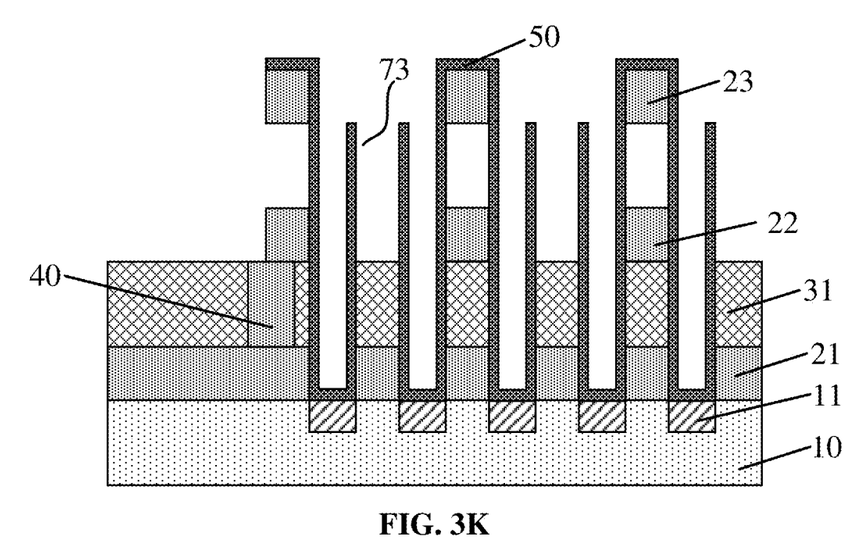
FIG. 3K is an eleventh schematic structural diagram of a capacitor array during manufacturing according to an embodiment of the disclosure.

Next, as shown in FIG. 3K, part of second support layer 22 is removed by means of dry etching, to form a plurality of second openings 73 exposing the first sacrificial layer 31. The remaining second support layer is formed as the second support layer of the capacitor array.

Figure 3L:
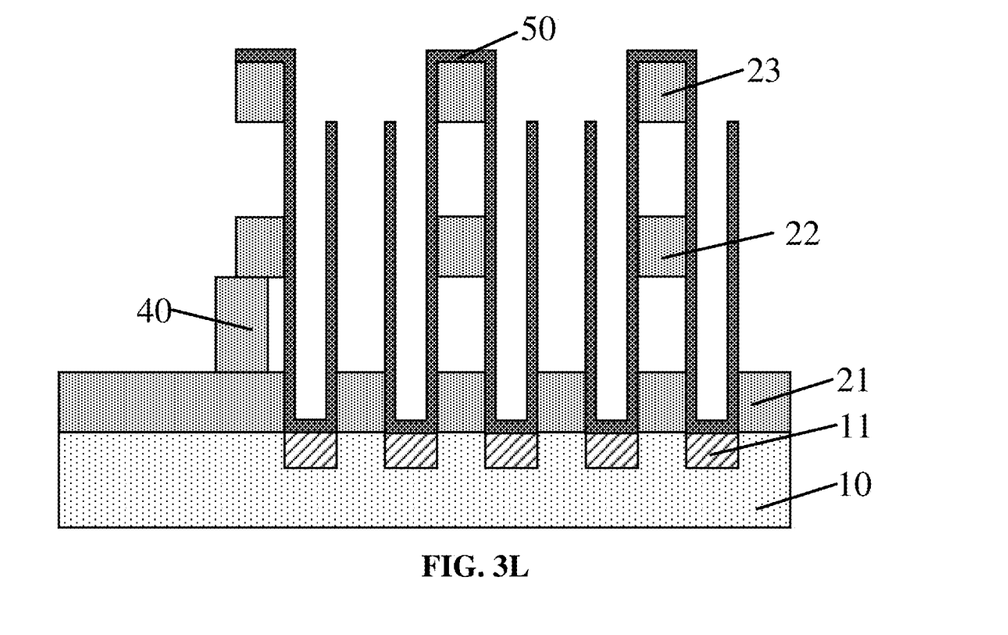
FIG. 3L is a thirteenth schematic structural diagram of a capacitor array during manufacturing according to an embodiment of the disclosure.
Figure 4:
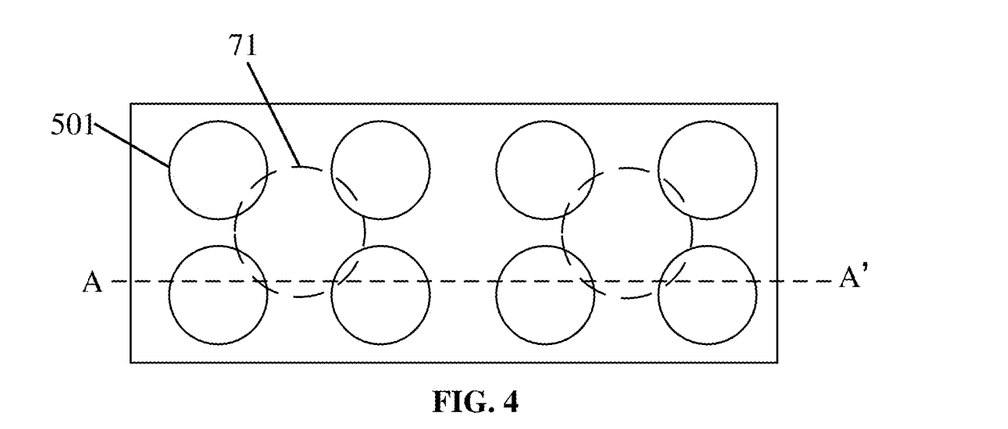
FIG. 4 is a top view of a capacitor array according to an embodiment of the disclosure.

Next, as shown in FIG. 3L, the first sacrificial layer 31 is removed through the second openings 73 by means of wet etching, to expose the first support layer 21.

Specifically, based on the second openings 73, the acid solution may be injected, so as to remove the first sacrificial layer 31. It is to be noted that, according to a material of the first sacrificial layer 31, the corresponding acid solution may be selected, so that acid pickling efficiency can be enhanced, and the first sacrificial layer 31 may be guaranteed to be completely cleaned.

In an embodiment, there is a high etching selectivity ratio between a material of the first sacrificial layer 31 and of the second sacrificial layer 32 and a material of the second support layer 22 and of the third support layer 23. Therefore, it can be guaranteed that during etching, the entire first sacrificial layer and the entire second sacrificial layer can be removed without damaging the second support layer and the third support layer, so that the firmness of the capacitor array can be improved, thereby guaranteeing that the capacitor array is not easy to collapse.

In an embodiment, each of the mask opening 71, the first opening 72 and the second opening 73 partially overlaps with each of the second vias 501.

In an embodiment, in a same step of removing the first sacrificial layer 31 and the second sacrificial layer 32 in the device area 10A, and the second support layer 22 and the third support layer 23 under the mask openings 71 in the device area 10A, the method further includes the following operation.

The first sacrificial layer 31, the second sacrificial layer 32, and part of the first support layer 21, part of the second support layer 22 and part of the third support layer 23 in the peripheral area 10B are removed. The reserved first support layer 21, the reserved second support layer 22 and the reserved third support layer 23 are connected to an outer wall of a cylindrical structure formed by the electrode layer 50. The support pillar 40 is connected to the first support layer 21 and the second support layer 22.

Specifically, as shown in FIG. 3H and FIG. 3L, in the etching step of removing the third support layer 23 under the mask openings 71 in the device area 10A, the third support layer 23 under the mask openings 71 in the peripheral area 10B is removed simultaneously (referring to FIG. 3I). In the etching step of removing the second sacrificial layer 32 on the device area 10A, the second sacrificial layer 32 on the peripheral area 10B is removed simultaneously (referring to FIG. 3J). In the etching step of removing the second support layer 22 under the first openings 72 in the device area 10A, the second support layer 22 under the first openings 72 in the peripheral area 10B is removed simultaneously (referring to FIG. 3K). In the etching step of removing the first sacrificial layer 31 in the device area 10A, the first sacrificial layer 31 in the peripheral area 10B is removed simultaneously (referring to FIG. 3L).

Figure 5:
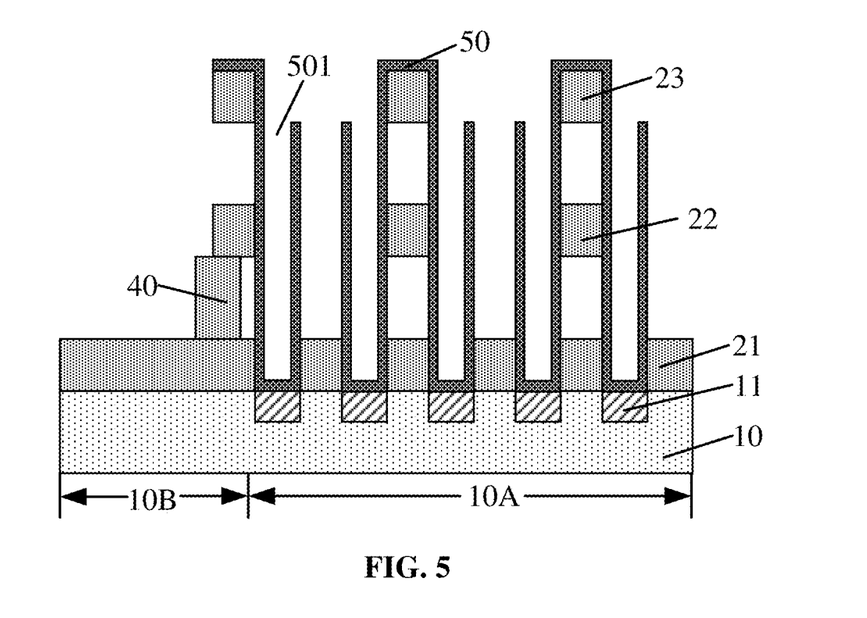
FIG. 5 is a schematic structural diagram of a capacitor array according to an embodiment of the disclosure.

An embodiment of the disclosure further provides a capacitor array. FIG. 5 is a schematic structural diagram of a capacitor array according to an embodiment of the disclosure.

As shown in FIG. 5, the capacitor array includes: a substrate 10, provided with a device area 10A configured for forming a capacitor and a peripheral area 10B located at a periphery of the device area 10A; a first support layer 21 located on the substrate 10 and a second support layer 22 located on the first support layer 21; and a support pillar 40 located in the peripheral area 10B. The support pillar 40 is connected to the first support layer 21 and the second support layer 22.

In this embodiment of the disclosure, by forming the support pillar 40 in the peripheral area 10B of the capacitor array, a capacitor may be prevented from falling over, thereby reducing the risk of collapse or peeling. In addition, the support pillar 40 may further block the penetration of an acid solution to the capacitor during etching, to avoid damage to capacitor.

The substrate 10 may be a monoatomic semiconductor material substrate (for example, a Silicon (Si) substrate, a germanium (Ge) substrate, and the like), a compound semiconductor material substrate (for example, a silicon germanium (SiGe) substrate), a Silicon-On-Insulator (SOI) substrate, Germanium-On-Insulator (GeOI) substrate, and the like.

The device area 10A and the peripheral area 10B may be isolated by means of a trench isolation structure (not shown in the figure).

By using the shallow trench isolation structure to insulate and isolate the device area 10A from the peripheral area 10B, short circuit between the device area 10A and the peripheral area 10B can be prevented, so that the operation performance of the device can be improved.

A capacitor contact 11 is formed in the substrate 10 and is electrically connected to the electrode layer 50 of a capacitor formed subsequently.

Materials of the first support layer 21 and the second support layer 22 include, but are not limited to, silicon nitride.

The first support layer 21 and the second support layer 22 may both be formed by means of a deposition process, for example, may be formed by means of chemical vapor deposition.

In an embodiment, a material of the support pillar 40 includes an acid-resisting material. Specifically, the material of the support pillar 40 includes, but is not limited to, silicon nitride. It is understandable that, by selecting the material of the support pillar to be the acid-resisting material, penetration of the acid solution cannot occur when wet etching is performed subsequently, so that the stability of the capacitor can be improved.

In an embodiment, the capacitor array further includes: a third support layer 23, located on the second support layer 22; second vias 501, located in the device area 10A, where the second vias 501 penetrate through the first support layer 21, the second support layer 22 and the third support layer 23, to expose the substrate 10; and an electrode layer 50, covering a sidewall and bottom surface of each of the second vias 501 and a surface of the third support layer 23.

A material of the third support layer 23 includes, but is not limited to, silicon nitride. The third support layer 23 may be formed by means of a deposition process, for example, may be formed by means of chemical vapor deposition.

In this embodiment of the disclosure, the first support layer 21, the second support layer 22 and the third support layer 23 are formed. A plurality of support layers are arranged in a stack manner, the stability of the device can be improved, and the risk of the breakage of the support layers can be reduced.

The capacitor contacts 11 in the substrate 10 are exposed from the second vias 501, so that the formed electrode layer 50 can be electrically connected to the capacitor contacts 11 at the bottoms of the second vias 501.

The electrode layer 50 may be a polysilicon electrode, or may be a metal electrode. When the electrode layer 50 is the metal electrode, for example, may be formed by using titanium nitride (TiN).

In some embodiments, as shown in FIG. 5, the electrode layer 50 further covers the surface of the third support layer 23.

In some other embodiments, the electrode layer 50 does not cover the surface of the third support layer 23. Specifically, the electrode layer 50 may be formed by the deposition process, in combination with a planarization process. For example, firstly, an electrode material layer is formed on the substrate 10. The electrode material layer covers the bottom and sidewall of each of the second vias 501, and covers the third support layer 23. Next, the planarization process (for example, a chemical mechanical polishing process) is performed, to remove a portion of the electrode material layer above the third support layer 23, so that the remaining electrode material layer only is formed in the second vias 501, so as to form the electrode layer 50.

In this embodiment of the disclosure, by means of forming the support pillar in the peripheral area of the capacitor array, a capacitor may be prevented from falling over, thereby reducing the risk of collapse or peeling. In addition, the support pillar may further block the penetration of an acid solution to the capacitor during etching.

The disclosure further provides a semiconductor device, including the capacitor array described in any one of the above embodiments.

In an embodiment, the semiconductor device is applied to a DRAM.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

What is claimed is:

1. A method for manufacturing a capacitor array, comprising:
   providing a substrate, provided with a device area configured for forming a capacitor and a peripheral area located at a periphery of the device area;
   forming successively a first support layer and a first sacrificial layer on the substrate;
   etching the first sacrificial layer in the peripheral area to expose the first support layer, so as to form a first via; and
   filling the first via to form a support pillar;
   forming successively a second support layer, a second sacrificial layer and a third support layer on the first sacrificial layer, after the support pillar is formed, wherein the second support layer, the second sacrificial layer, and the third support layer form a laminated structure together with the first support layer and the first sacrificial layer; and
   etching the laminated structure in the device area to expose the substrate, so as to form second vias;
   forming an electrode layer after the second vias are formed, wherein the electrode layer covers a sidewall and a bottom surface of each of the second vias;
   forming a mask layer on the laminated structure after the electrode layer is formed;
   forming mask openings based on the mask layer; and
   removing the first sacrificial layer and the second sacrificial layer in the device area, and the second support layer and the third support layer under the mask openings in the device area, based on the mask openings, wherein the reserved second support layer, the reserved third support layer and the first support layer are connected to an outer wall of a cylindrical structure formed by the electrode layer.

2. The method of claim 1, wherein
   removing the first sacrificial layer, the second sacrificial layer, and the second support layer and the third support layer under the mask openings, based on the mask openings comprises: forming first openings in the third support layer based on the mask openings to expose the second sacrificial layer; removing the second sacrificial layer based on the first openings; forming second openings in the second support layer to expose the first sacrificial layer; and removing the first sacrificial layer based on the second openings.

3. The method of claim 2, wherein
   each of the mask opening, the first opening and the second opening partially overlaps with each of the second vias.

4. The method of claim 1, wherein
   a material of the support pillar comprises an acid-resisting material.

5. The method of claim 1, wherein
capacitor contacts are formed in the substrate and are electrically connected to the electrode layer.

6. The method of claim 1, wherein in a same step of removing the first sacrificial layer and the second sacrificial layer in the device area, and the second support layer and the third support layer under the mask openings in the device area, the method further comprises:
removing the first sacrificial layer, the second sacrificial layer, and part of the first support layer, part of the second support layer and part of the third support layer in the peripheral area, wherein the reserved first support layer, the reserved second support layer and the reserved third support layer are connected to an outer wall of a cylindrical structure formed by the electrode layer, and the support pillar is connected to the first support layer and the second support layer.

7. A method for manufacturing a capacitor array, comprising:
providing a substrate, provided with a device area configured for forming a capacitor and a peripheral area located at a periphery of the device area;
forming successively a first support layer and a first sacrificial layer on the substrate;
etching the first sacrificial layer in the peripheral area to expose the first support layer, so as to form a first via; and
filling the first via to form a support pillar;
forming successively a second support layer, a second sacrificial layer and a third support layer on the first sacrificial layer, after the support pillar is formed, wherein the second support layer, the second sacrificial layer, and the third support layer form a laminated structure together with the first support layer and the first sacrificial layer; and
etching the laminated structure in the device area to expose the substrate, so as to form second vias;
forming an electrode layer after the second vias are formed, wherein the electrode layer covers a sidewall and a bottom surface of each of the second vias;
forming a mask layer on the laminated structure after the electrode layer is formed;
forming mask openings based on the mask layer; and
removing the first sacrificial layer and the second sacrificial layer in the device area, and the second support layer and the third support layer under the mask openings in the device area, based on the mask openings, wherein the reserved second support layer, the reserved third support layer and the first support layer are connected to an outer wall of a cylindrical structure formed by the electrode layer;
wherein there is a high etching selectivity ratio between a material of the first sacrificial layer and of the second sacrificial layer and a material of the second support layer and of the third support layer.

8. The method of claim 7, wherein
a material of the support pillar comprises an acid-resisting material.

9. The method of claim 7, wherein
capacitor contacts are formed in the substrate and are electrically connected to the electrode layer.

10. The method of claim 7, wherein in a same step of removing the first sacrificial layer and the second sacrificial layer in the device area, and the second support layer and the third support layer under the mask openings in the device area, the method further comprises:
removing the first sacrificial layer, the second sacrificial layer, and part of the first support layer, part of the second support layer and part of the third support layer in the peripheral area, wherein the reserved first support layer, the reserved second support layer and the reserved third support layer are connected to an outer wall of a cylindrical structure formed by the electrode layer, and the support pillar is connected to the first support layer and the second support layer.

11. The method of claim 7, wherein
removing the first sacrificial layer, the second sacrificial layer, and the second support layer and the third support layer under the mask openings, based on the mask openings comprises: forming first openings in the third support layer based on the mask openings to expose the second sacrificial layer; removing the second sacrificial layer based on the first openings; forming second openings in the second support layer to expose the first sacrificial layer; and removing the first sacrificial layer based on the second openings.

12. The method of claim 11, wherein
each of the mask opening, the first opening and the second opening partially overlaps with each of the second vias.

* * * * *